(12) United States Patent
Du et al.

(10) Patent No.: US 9,589,583 B1
(45) Date of Patent: Mar. 7, 2017

(54) CURRENT-PERPENDICULAR-TO-PLANE MAGNETO-RESISTANCE EFFECT ELEMENT

(71) Applicant: NATIONAL INSTITUTE FOR MATERIALS SCIENCE, Ibaraki (JP)

(72) Inventors: Ye Du, Ibaraki (JP); Takao Furubayashi, Ibaraki (JP); Yukiko Takahashi, Ibaraki (JP); Kazuhiro Hono, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/339,094

(22) Filed: Oct. 31, 2016

Related U.S. Application Data

(63) Continuation of application No. 14/774,987, filed as application No. PCT/JP2014/059778 on Apr. 2, 2014.

(30) Foreign Application Priority Data

Apr. 5, 2013  (JP) ................................. 2013-079344

(51) Int. Cl.
*G11B 5/39*  (2006.01)
(52) U.S. Cl.
CPC ................................. *G11B 5/3906* (2013.01)
(58) Field of Classification Search
CPC ......... G11B 5/39; G11B 5/127; G11B 5/3906; G11B 5/1278

(Continued)

(56) References Cited

U.S. PATENT DOCUMENTS 7,554,774 B2    6/2009  Kim
7,709,867 B2    5/2010  Ishikawa
(Continued)

FOREIGN PATENT DOCUMENTS

JP    2005-116701    4/2005
JP    2010-212631    9/2010
(Continued)

OTHER PUBLICATIONS

International Search Report issued Jun. 3, 2014 in International (PCT) Application No. PCT/JP2014/059778.
(Continued)

*Primary Examiner* — Allen T Cao
(74) *Attorney, Agent, or Firm* — Wenderoth, Lind & Ponack, L.L.P.

(57) ABSTRACT

The CPPGMR element of the present invention has an orientation layer 12 formed on a substrate 11 to texture a Heusler alloy into a (100) direction, an underlying layer 13 that is an electrode for magneto-resistance measurement stacked on the orientation layer 12, a lower ferromagnetic layer 14 and an upper ferromagnetic layer 16 each stacked on the underlying layer 13 and made of a Heusler alloy, a spacer layer 15 sandwiched between the lower ferromagnetic layers 14 and the upper ferromagnetic layers 16, and a cap layer 17 stacked on the upper ferromagnetic layer 16 for surface-protection. This manner makes it possible to provide, inexpensively, an element using a current-perpendicular-to-plane giant magneto-resistance effect (CPPGMR) of a thin film having a trilayered structure of a ferromagnetic metal/a nonmagnetic metal/a ferromagnetic metal, thereby showing excellent performances.

7 Claims, 4 Drawing Sheets

(58) Field of Classification Search
USPC .................. 360/324.2, 324.12, 324.1, 324
See application file for complete search history.

(56) References Cited

U.S. PATENT DOCUMENTS

| | | |
|---|---|---|
| 2004/0004261 A1 | 1/2004 | Takahashi |
| 2005/0073778 A1 | 4/2005 | Hasegawa |
| 2006/0050445 A1 | 3/2006 | Kim |
| 2010/0072529 A1 | 3/2010 | Marukame |
| 2010/0200899 A1 | 8/2010 | Marukame |
| 2011/0007421 A1 | 1/2011 | Hara |
| 2013/0164549 A1 | 6/2013 | Nishioka |
| 2014/0084398 A1 | 3/2014 | Oguz |
| 2014/0334041 A1* | 11/2014 | Hase ............... G01R 33/00 360/319 |
| 2015/0228394 A1 | 8/2015 | Nakada |

FOREIGN PATENT DOCUMENTS

| | | |
|---|---|---|
| JP | 2010-229477 | 10/2010 |
| JP | 2011-35336 | 2/2011 |
| JP | 2012-190914 | 10/2012 |
| JP | 2013-247259 | 12/2013 |

OTHER PUBLICATIONS

Takahashi et al., "All-metallic lateral spin valves using Co2Fe(Ge0.5Ga0.5) Heusler alloy with a large spin signal", Applied Physics Letters, vol. 100, 2012, pp. 052405-1-052405-4.

Sakuraba et al., "Extensive study of giant magnetoresistance properties in half-metallic Co2(Fe,Mn)Si-based devices", Applied Physics Letters, vol. 101, 2012, pp. 252408-1-252408-4.

Wang et al., "Large tunnel magnetoresistance in Co 2 Fe Al 0.5 Si 0.5 Mg O Co 2 Fe Al 0.5 Si 0.5 magnetic tunnel junctions prepared on thermally oxidized Si substrates with MgO buffer", Applied Physics Letters, vol. 93, 2008, pp. 182504-1-182504-3.

Yoshimura et al., "Effect of buffer layer and seedlayer materials on control of crystallographic orientation of $Co_2MnGe$ layer onto a thermally oxidized Si wafer", Journal of Magnetism and Magnetic Materials, vol. 310, 2007, pp. 1978-1980.

Du et al., "001 textured polycrystalline current-perpendicular-to-plane pseudo spin-valves using Co2Fe(Ga0.5Ge0.5) Heusler alloy", Applied Physics Letters, vol. 103, 2013, pp. 202401-1-202401-4.

Du et al., "001-textured polycrystalline current-perpendicular-to-plane pseudo spin-valves using full Heusler alloy $Co_2Fe(Ga_{0.5}Ge_{0.5})$", Digests of the 37th annual conference on magnetics in Japan, 2013, p. 49.

* cited by examiner

CURRENT-PERPENDICULAR-TO-PLANE MAGNETO-RESISTANCE EFFECT ELEMENT

TECHNICAL FIELD

The present invention relates to an element using a current-perpendicular-to-plane giant magneto-resistance effect (CPPGMR) of a thin film having a trilayered structure of a ferromagnetic metal/a nonmagnetic metal/a ferromagnetic metal, in particular, a current-perpendicular-to-plane giant magneto-resistance effect element using an ordinarily usable surface-oxidized Si substrate, silicon substrate, glass substrate, metal substrate or the like instead of an expensive MgO monocrystalline substrate.

BACKGROUND ART

Elements each using a current-perpendicular-to-plane giant magneto-resistance effect (referred to also as a CPPGMR hereinafter) of a thin film having a trilayered structure of a ferromagnetic metal/a nonmagnetic metal/a ferromagnetic metal have been expected for readout heads for magnetic disks. Researches have been made about elements each using a Heusler alloy, which is large in spin polarizability, as each of the ferromagnetic metals. A development has been made about a CPPGMR element using a polycrystalline thin film having a crystal orientation textured into a (110) direction as a layer of the Heusler alloy (for example, Patent Literatures 1 to 3).

By contrast, it is demonstrated that in a CPPGMR element, the use of a monocrystalline thin film textured into a (100) direction makes it possible to improve performances of the element (for example, Non Patent Literatures 1 and 2). However, for the production of the monocrystalline thin film, an expensive MgO monocrystalline substrate is required, and thus such methods are impracticable from the viewpoint of costs.

CITATION LIST

Patent Literatures

Patent Literature 1: JP 2010-212631 A
Patent Literature 2: JP 2011-35336 A
Patent Literature 3: JP 2005-116701 A

Non Patent Literatures

Non Patent Literature 1: Appl. Phys. Lett. 100, 052405 (2012).
Non Patent Literature 2: Appl. Phys. Lett. 101, 252408 (2012).

SUMMARY OF INVENTION

Technical Problem

The present invention has been made in light of actual situations of the above-mentioned conventional techniques, and an object of the invention is to provide, without using any MgO monocrystalline substrates, a CPPGMR element more inexpensive and better in performances than CPPGMR elements each using a polycrystalline thin film having a crystal orientation textured to a (110) direction.

Solution to Problem

In order to solve the above-mentioned problems, the present invention provides a CPPGMR element having structural requirements described below.

For example, as illustrated in FIG. 1, the CPPGMR element of the present invention includes, an orientation layer 12 on a substrate 11 to texture Heusler alloy into a (100) direction, a lower ferromagnetic layer 14 and an upper ferromagnetic layer 16 that each includes a polycrystalline thin film of a Heusler alloy textured into a (100) direction, and that are each stacked on the orientation layer 12, and a spacer layer 15 sandwiched between the lower ferromagnetic layer 14 and the upper ferromagnetic layer 16.

In the CPPGMR element of the present invention, it is preferred that: the substrate 11 is at least one of a surface-oxidized Si substrate, a silicon substrate, a glass substrate, and a metal substrate; the orientation layer 12 includes at least one of MgO, TiN, and NiTa alloys; the lower ferromagnetic layer 14 and the upper ferromagnetic layer 16 each includes a Heusler alloy represented by a composition formula of $Co_2AB$ wherein A is Cr, Mn, or Fe, or a mixture obtained by mixing two or more of these elements with each other to set the total quantity of the mixed elements to 1, and B is Al, Si, Ga, Ge, In, or Sn, or a mixture obtained by mixing two or more of these elements with each other to set the total quantity of the mixed elements to 1; and the spacer layer 15 is at least one metal selected from the group consisting of Ag, Al, Cu, Au, and Cr, or any alloys of the selected metal(s).

In the CPPGMR element of the present invention, it is preferred that at least one of the orientation layer 12, the lower ferromagnetic layer 14, the upper ferromagnetic layer 16, and the spacer layer 15 is formed by a sputtering method.

In the CPPGMR element of the present invention, it is further preferred that an underlying layer 13 for magneto-resistance measurement is laid to be sandwiched between the orientation layer 12 and the lower ferromagnetic layer 14. The underlying layer 13 can be formed, using at least one metal selected from the group consisting of Ag, Al, Cu, Au, and Cr, or any alloys of the selected metal(s). It is advisable to form the underlying layer 13 by a sputtering method.

In the CPPGMR element of the present invention, it is also preferred that a cap layer 17 to be stacked on the upper ferromagnetic layer 16 for surface protection. The cap layer 17 may be formed, using at least one metal selected from the group consisting of Ag, Al, Cu, Au, Ru, and Pt, or any alloys of the selected metal(s). It is advisable to form the cap layer 17 by a sputtering method.

Advantageous Effects of Invention

In the present invention, an orientation layer is laid over a substrate including at least one of a surface-oxidized Si substrate, a silicon substrate, a glass substrate, and a metal substrate, which are inexpensive, without using any MgO monocrystalline substrates to produce a CPPGMR element including a (100)-textured polycrystalline thin film. It has been verified that this production makes the resultant element better in properties than any production using a (110)-textured polycrystalline thin film. Such a structure makes it possible to produce a CPPGMR element more inexpensive and higher in performances.

DESCRIPTION OF EMBODIMENTS

Figure 1:
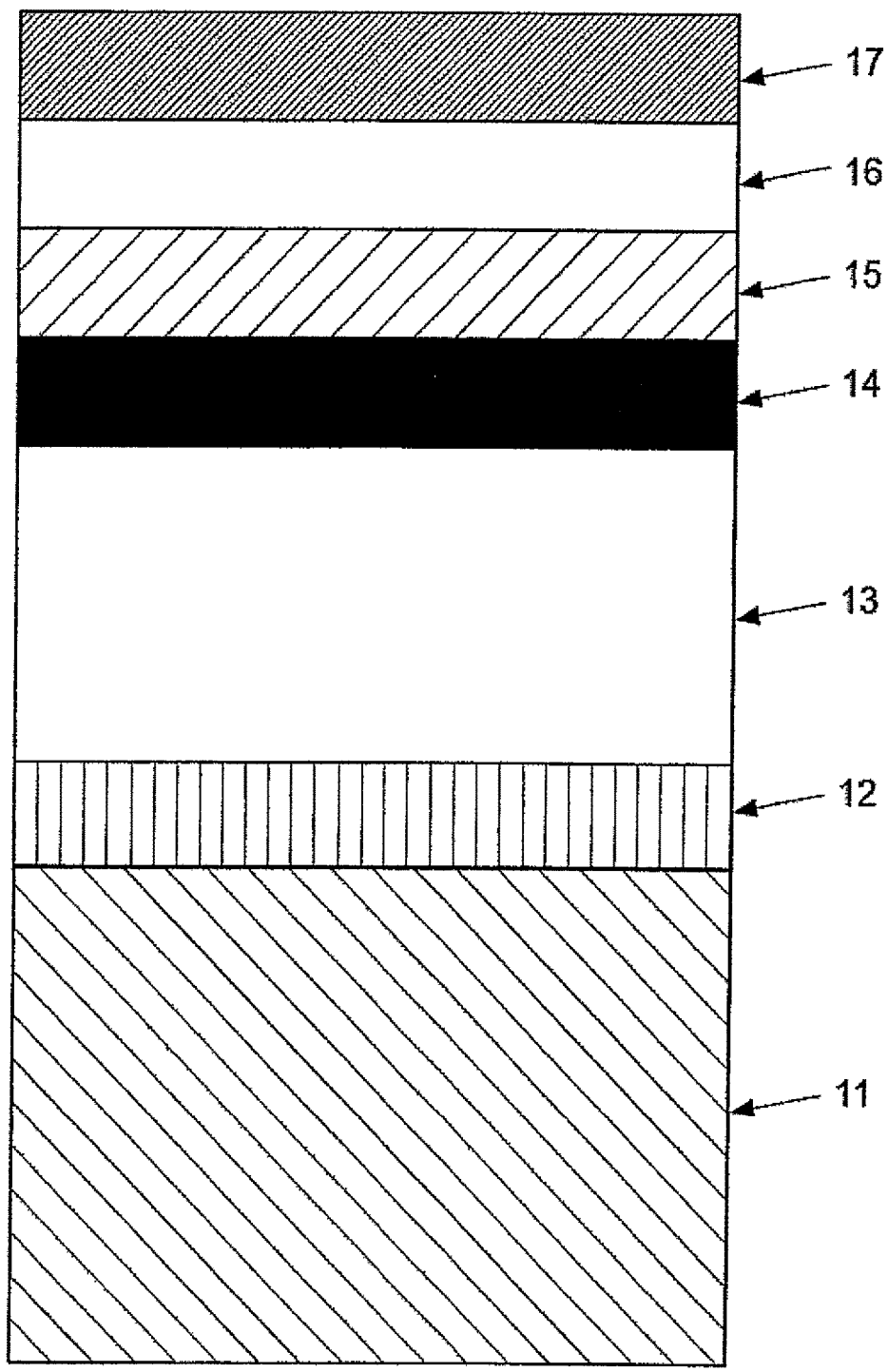
FIG. 1 is a schematic structural view of a CPPGMR element according to an embodiment of the present invention.

Hereinafter, the present invention will be described, referring to the drawings.

FIG. 1 is a schematic structural view of a current-perpendicular-to-plane magneto-resistance effect (CPPGMR) element according to an embodiment of the present invention. In the figure, the CPPGMR element of the present embodiment is configured by a substrate 11, an orientation layer 12, an underlying layer 13, a lower ferromagnetic layer 14, a spacer layer 15, an upper ferromagnetic layer 16, and a cap layer 17 stacked in this order.

The substrate 11 is most preferably a surface-oxidized Si substrate from the viewpoint of costs, but may be a silicon substrate for semiconductor-production, or may be a glass substrate or a metal substrate. It is sufficient for the orientation layer 12 to be a layer having an effect of texturing a Heusler alloy into a (100) direction. Thus, the orientation layer 12 is preferably a layer containing at least one of MgO, TiN, and NiTa alloys. Of these components, MgO and TiN are crystalline. Such a crystalline orientation layer is textured into a (100) direction to grow easily, so that the layer itself undergoes (100) orientation to induce the (100) orientation of a Heusler alloy. Although NiTa is amorphous, NiTa induces the (100) orientation of a Heusler alloy growing on this component. When the substrate 11 has a crystal orientation, NiTa simultaneously has an effect of breaking off any effect of the crystal orientation. The underlying layer 13 is made of a metal or an alloy, and is to be an electrode for magneto-resistance measurement. For the underlying layer 13, the following is usable: a metal containing at least one of Ag, Al, Cu, AuCr and others; or any alloys of one or more of these metal elements. A different underlying layer may be added below the orientation layer 12.

The lower ferromagnetic layer 14 and the upper ferromagnetic layer 16 each contains a polycrystalline Heusler alloy textured to a (100) direction represented by a composition formula of $Co_2AB$ wherein A is Cr, Mn, or Fe, or a mixture obtained by mixing two or more of these elements with each other to set the total quantity of the mixed elements to 1, and B is Al, Si, Ga, Ge, In, or Sn, or a mixture obtained by mixing two or more of these elements with each other to set the total quantity of the mixed elements to 1. The Heusler alloy is in particular preferably a $Co_2FeGa_{0.5}Ge_{0.5}$ (CFGG) polycrystalline thin film, but may be a $Co_2Fe Al_{1-x}Si_x$, $Co_2MnSi$ or $Co_2Fe_{1-x}Mn_xSi$ polycrystalline thin film. For the upper ferromagnetic layer and the lower ferromagnetic layer, one Heusler alloy may be used. Alternatively, any combination of two or more Heusler alloys may be used, as well as any combination of one or more Heusler alloys with one or more different metals or alloys.

The spacer layer 15 is made of a metal or an alloy. The cap layer 17 is made of a metal or an alloy for surface-protection. For the spacer layer 15, the following is usable: for example, a metal containing at least one of Ag, Al, Cu, Au, Cr, and others; or any alloys of one or more of these metal elements. For the cap layer 17, the following is usable: for example, a metal containing at least one of Ag, Al, Cu, Au, Ru, Pt, and others; or any alloys of one or more of these metal elements.

For each of the orientation layer 12, the underlying layer 13, the spacer layer 15, and the cap layer 17, a single material may be used, or two or more materials stacked onto each other may be used.

It is preferred to form at least one of the orientation layer 12, the lower ferromagnetic layer 14, the upper ferromagnetic layer 16, and the spacer layer by a sputtering method. It is also preferred to anneal the stacked-film at a temperature of 200 to 450° C. for about 15 to 60 minutes to be improved in crystal structure.

Examples

The following will describe examples of the present invention.

Figure 3:
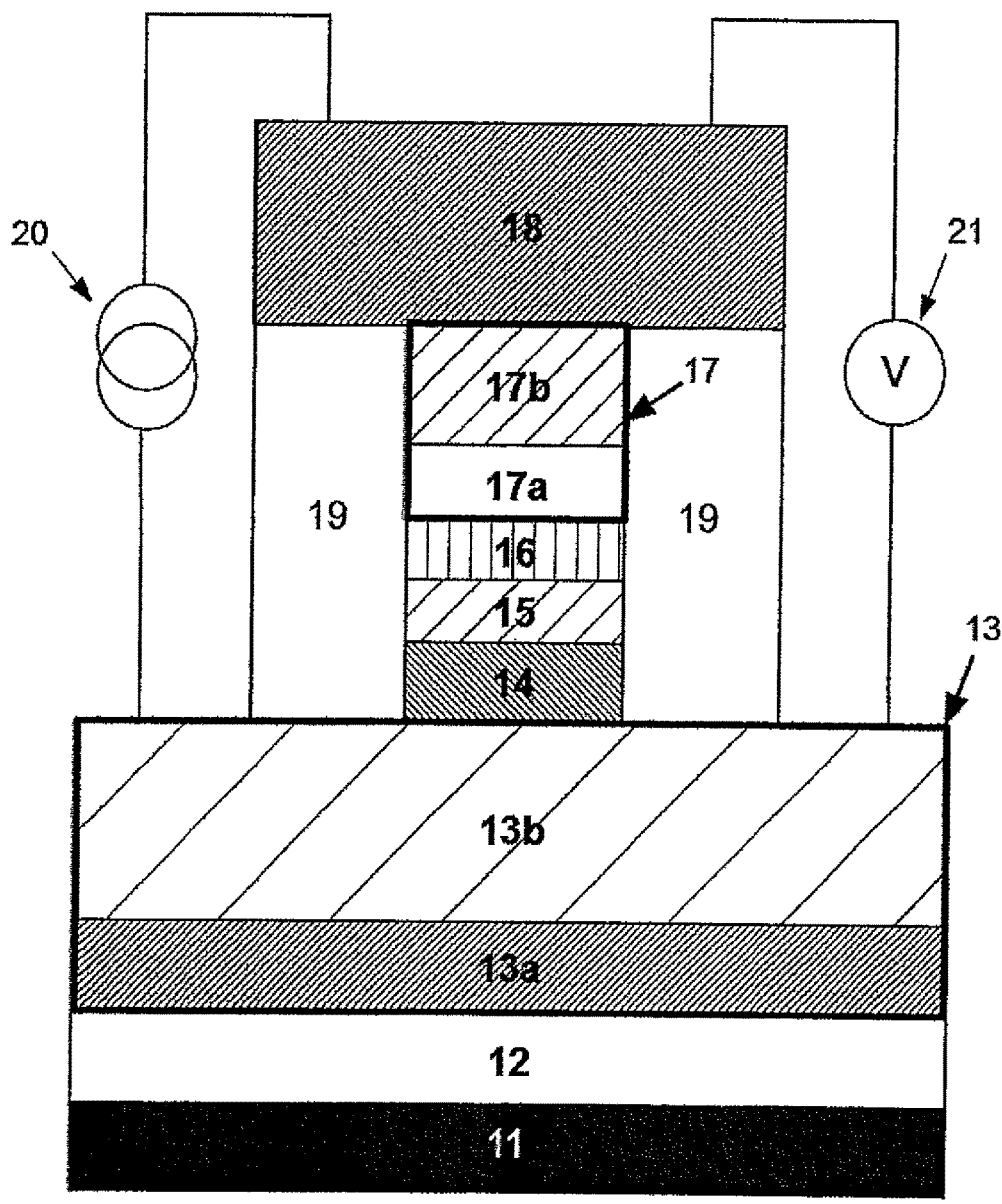
FIG. 3 is a schematic sectional view of a CPPGMR element according to an embodiment of the present invention.

FIG. 3 is a schematic sectional view of a CPPGMR element according to an example of the present invention. In the figure, a surface-oxidized Si substrate is used as a substrate 11; MgO is used as an orientation layer 12; a stacked Cr layer 13a and Ag layer 13b, the Cr layer 13a being positioned below, as an underlying layer 13; a polycrystalline (0001)-textured Heusler alloy, $Co_2FeGa_{0.5}Ge_{0.5}$ (CFGG), as an upper ferromagnetic layer 14 and a lower ferromagnetic layer 16; Ag as a spacer layer 15; and a stacked Ag layer 17a and Ru layer 17b, the Ag layer 17a being positioned below, as a cap layer 17.

The CPPGMR element of the present example is an element obtained by forming, onto the oxidized Si substrate, respective films of the following from below: MgO(10)/Cr (20)/Ag(50)/CFGG(10)/Ag(7)/CFGG(10)/Ag(5)/Ru(8). The number in each pair of parentheses represents the film thickness (nm). By a sputtering method, the film-formation of the layer structure is attained.

Figure 2:
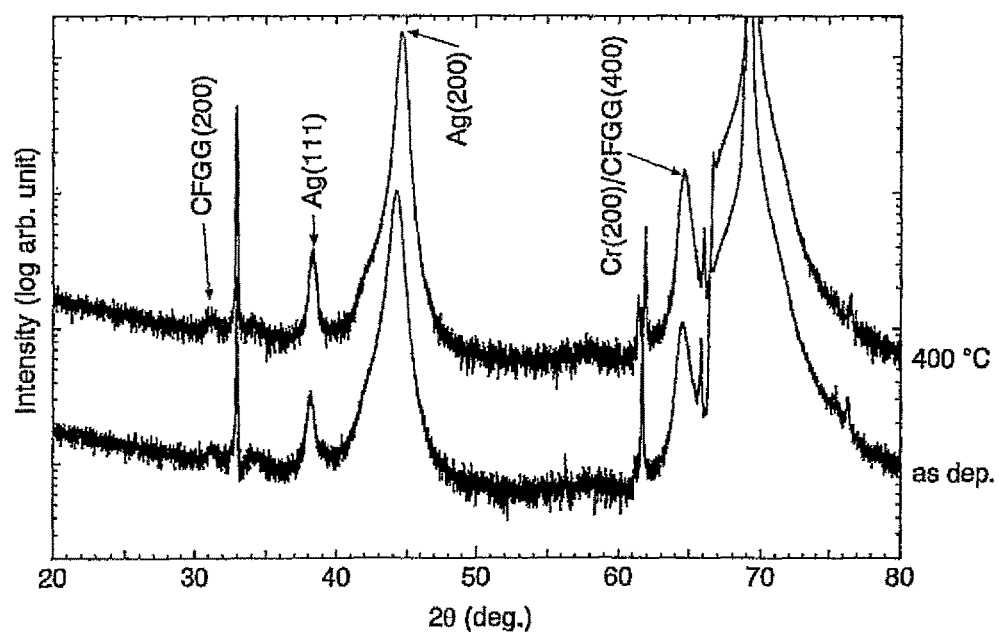
FIG. 2 is a chart showing an X-ray diffraction pattern of a film obtained by stacking, onto an oxidized Si substrate, respective films of the following from below: MgO(10)/Cr (20)/Ag(50)/CFGG(10)/Ag(7)/CFGG(10)/Ag(5)/Ru(8).

FIG. 2 is an X-ray diffraction pattern of the stack having the film structure illustrated in FIG. 3. According to the X-ray diffraction, the structure of the crystal was examined. As a result, it was understood from the results shown in FIG. 2 that the layer of each of Cr, Ag, and CFGG was textured into a (100) direction. In order to improve the thin film in crystal structure, the sample was annealed at 400° C. for 30 minutes. Thereafter, to measure the electric resistance in the direction perpendicular to the plane of the film, the workpiece was finely worked, as illustrated in FIG. 3, and a silicon oxide ($SiO_2$) layer 19 was laid adjacently to the stack composed of the upper ferromagnetic layer 14, the spacer layer 15, the lower ferromagnetic layer 16, and the cap layer 17. Next, a Cu electrode layer 18 was attached onto the cap layer 17 and the silicon oxide layer 19. A constant-current source 20 was connected between the underlying layer 13 and the Cu electrode layer 18, and a voltmeter 21 was connected between the underlying layer 13 and the Cu electrode layer 18. The constant-current source 20 and the voltmeter 21 were used to examine a change in the electric resistance of the CPPGMR element versus the magnetic field. Furthermore, while the temperature for annealing the sample was varied between 300° C. and 450° C., the variation ΔRA of the electric resistance per unit area of the element was examined.

Figure 4:
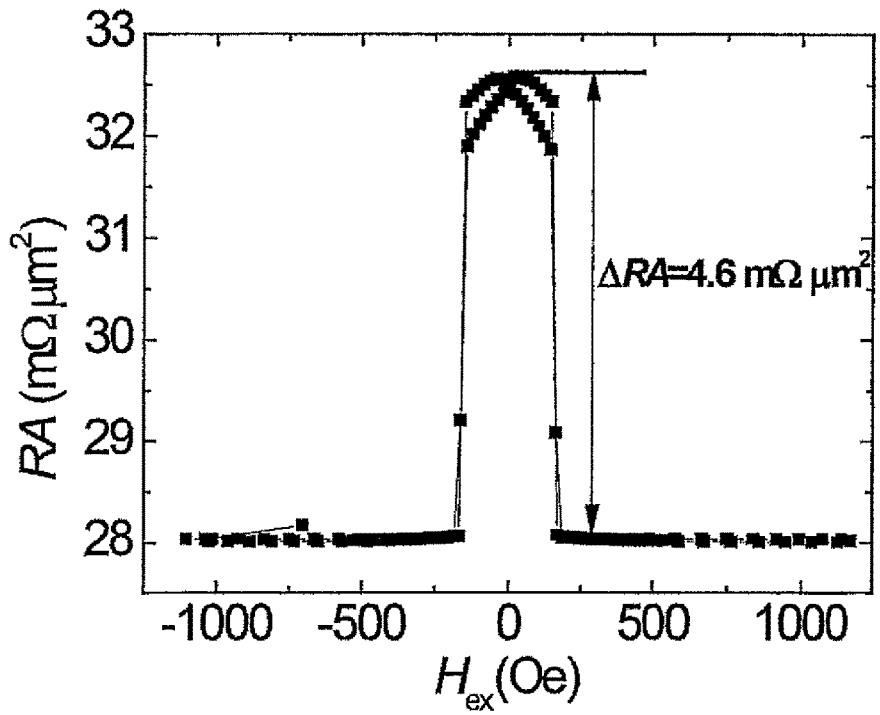
FIG. 4 is a graph demonstrating a change in the value of "the area of an element"×"the electric resistance thereof" versus a magnetic field applied thereto.

FIG. 4 shows a change in the electric resistance of the CPPGMR element versus the magnetic field. When the magnetic field was in the range of about ±200 [Oe] (=1000/

(4π)A)/m), the following variation of the electric resistance was obtained per unit area of the element: a variation ΔRA of 4.6 [mΩ·μm²].

For comparison, without using any MgOs (orientation layers), a sample was produced to have a film structure having, over an oxidized Si substrate, respective films of the following: Ta(5)/Cu(250)/Ta(5)/CFGG(5)/Ag(7)/CFGG(5)/Ag(5)/Ru(6), T(2) and Ru(2). The sample was measured in the same way. It was verified about this sample that the crystal orientation of CFGG was textured to (110).

Figure 5:
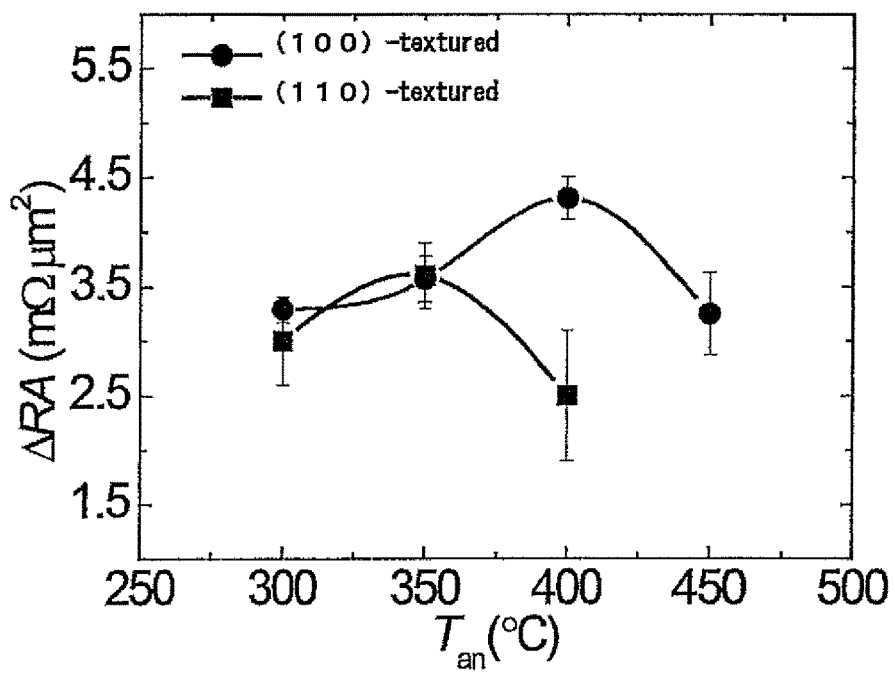
FIG. 5 is a graph demonstrating results of the value ΔRA of "the change of the magneto-resistance thereof"×"the area of an element" versus annealing temperature, in which black squares show results of a (110)-textured orientation film according to a conventional method.

FIG. 5 is a graph obtained by plotting the variation ΔRA of the electric resistance per unit area of each of the elements versus the annealing temperature $T_{an}$. About the (110)-textured sample according to the conventional technique, the variation ΔRA was lowered in the case of $T_{an}$>400° C. By contrast, about the (100)-textured sample according to the present invention, at a $T_{an}$ of 400° C., a variation ΔRA of 4.3 [mΩ·μm²] was obtained as the average value, which was a value larger than the maximum value 3.5 [mΩ·μm²] according to the conventional technique.

In a modified example of the present invention, a layer of an antiferromagnetic material may be further added, as a pinning layer, onto the upper ferromagnetic layer in the structure illustrated in FIG. 3. The antiferromagnetic material is, for example, any IrMn alloys or PtMn alloys. This layer structure, which has the upper ferromagnetic layer to which the pinning layer is added, makes it possible to restrain magnetization inversion in the upper ferromagnetic layer by exchange anisotropy to stabilize a state that the upper ferromagnetic layer and the lower ferromagnetic layer are magnetized in antiparallel to each other. The pinning layer may be inserted below the lower ferromagnetic layer.

In the above-mentioned embodiment, a case has been illustrated which has a film structure of MgO(10)/Cr(20)/Ag(50)/CFGG(10)/Ag(7)/CFGG(10)/Ag(5)/Ru(8). However, the present invention is not limited to this structure. Of course, the film material and the film thickness of each of the layers can be appropriately selected from scopes anticipated by those skilled in the art as far as the selected material and film thickness do not depart from the subject matters of the present invention.

INDUSTRIAL APPLICABILITY current-perpendicular-to-plane magneto-resistance effect (CPPGMR), is suitable for being used for a read head for a magnetic disk, and is usable for detecting fine magnetic information pieces.

REFERENCE SIGNS LIST

11: substrate
12: orientation layer
13: underlying layer
14: lower ferromagnetic layer
15: spacer layer
16: upper ferromagnetic layer
17: cap layer

The invention claimed is:

1. A current-perpendicular-to-plane magneto-resistance effect element, comprising:
   a substrate comprising at least one of a surface-oxidized Si substrate, a silicon substrate, a glass substrate, and a metal substrate;
   an orientation layer formed on the substrate to texture Heusler alloy into a (100) direction;
   a lower ferromagnetic layer and an upper ferromagnetic layer that each comprises a polycrystalline thin film of a Heusler alloy textured into a (100) direction, and that are each formed on the orientation layer; and
   a spacer layer sandwiched between the lower ferromagnetic layer and the upper ferromagnetic layer,
   wherein the orientation layer comprises at least one of MgO, TiN, and NiTa alloys,
   thereby improving a variation of the electric resistance per unit area of the element, compared with that of a (110) textured polycrystalline element not using an orientation layer.

2. The current-perpendicular-to-plane magneto-resistance effect element according to claim 1, wherein the spacer layer is at least one metal selected from the group consisting of Ag, Al, Cu, Au, and Cr, or any alloys of the selected metal(s).

3. The current-perpendicular-to-plane magneto-resistance effect element according to claim 1, wherein at least one of the orientation layer, the lower ferromagnetic layer, the upper ferromagnetic layer, and the spacer layer is formed by a sputtering method.

4. The current-perpendicular-to-plane magneto-resistance effect element according to claim 1, wherein an underlying layer that is an electrode for magneto-resistance measurement is laid to be sandwiched between the orientation layer and the lower ferromagnetic layer.

5. The current-perpendicular-to-plane magneto-resistance effect element according to claim 4, wherein the underlying layer comprises a metal or an alloy.

6. The current-perpendicular-to-plane magneto-resistance effect element according to claim 1, further comprising a cap layer stacked on the upper ferromagnetic layer for surface-protection.

7. The current-perpendicular-to-plane magneto-resistance effect element according to claim 6, wherein the cap layer comprises at least one metal selected from the group consisting of Ag, Al, Cu, Au, Ru, and Pt, or any alloys of the selected metal(s).

* * * * *